US 011881528B2

(12) United States Patent
Smith

(10) Patent No.: US 11,881,528 B2
(45) Date of Patent: Jan. 23, 2024

(54) TRANSISTOR WITH IMPLANT SCREEN

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/079,848

(22) Filed: Dec. 12, 2022

(65) Prior Publication Data

US 2023/0110692 A1 Apr. 13, 2023

Related U.S. Application Data

(63) Continuation of application No. 17/487,058, filed on Sep. 28, 2021, now Pat. No. 11,563,117.

(51) Int. Cl.

| H01L 29/78 | (2006.01) |
|---|---|
| H01L 21/8234 | (2006.01) |
| H01L 29/40 | (2006.01) |
| H01L 21/266 | (2006.01) |
| H01L 29/66 | (2006.01) |
| H01L 27/088 | (2006.01) |

(52) U.S. Cl.
CPC ........ *H01L 29/7833* (2013.01); *H01L 21/266* (2013.01); *H01L 21/823412* (2013.01); *H01L 27/088* (2013.01); *H01L 29/402* (2013.01); *H01L 29/66492* (2013.01)

(58) Field of Classification Search
CPC ............... H01L 29/7833; H01L 21/266; H01L 21/823412; H01L 27/088; H01L 29/402; H01L 29/66492; H01L 21/823418; H01L 29/0692; H01L 29/0847
See application file for complete search history.

(56) References Cited

U.S. PATENT DOCUMENTS

| 5,532,175 A | 7/1996 | Racanelli et al. |
| 9,577,041 B2 | 2/2017 | Bakhishev et al. |
| 11,437,496 B2 * | 9/2022 | Chuang ............ H01L 29/66803 |

* cited by examiner

*Primary Examiner* — David Vu
(74) *Attorney, Agent, or Firm* — Perkins Coie LLP

(57) ABSTRACT

An apparatus includes a substrate and a transistor disposed on the substrate. The transistor includes a source and a source contact disposed on the source. The transistor also includes a drain and a drain contact disposed on the drain. A gate is disposed between the source contact and the drain contact, and a screened region is disposed adjacent the source contact or the drain contact. The screened region corresponds to a lightly doped region. The screened region includes an implant screen configured to reduce an effective dose in the screened region so as to shift an acceptable dose range of the screened region to a higher dose range. The acceptable dose range corresponds to acceptable breakdown voltage values for the screened region.

20 Claims, 7 Drawing Sheets

TRANSISTOR WITH IMPLANT SCREEN

CROSS-REFERENCE TO RELATED APPLICATION(S)

This application is a continuation of U.S. patent application Ser. No. 17/487,058, filed Sep. 28, 2021, which is incorporated herein by reference in its entirety.

TECHNICAL FIELD

The present disclosure generally relates to transistors, and more particularly, to an implant screen to reduce an implant dose concentration in a region of a transistor.

BACKGROUND

Transistor devices, such as high voltage transistors, can include lightly doped regions with N- or P-implants (depending on the type of transistor). In some cases, the lightly doped regions can correspond to the contact-to-gate ("C2G") regions for the source and/or drain (the C2G region may also be referred to as a drain extension region, "DER," or "LDD region"). In some cases, the lightly doped regions can correspond to the contact-to-active area edge ("C2A") regions of the transistor. The doping in the C2G and C2A regions helps the transistor withstand high voltages. The high voltage range will depend on the type of application. For example, in memory devices certain logic transistors may need to withstand voltages in a range of 10 volts to 35 volts. Whereas, in power electronics, the high voltage transistors may need to withstand 100s of volts. In some devices, the implant dose concentration within each device can vary. For example, memory devices (and also other types of transistor devices) can have high voltage transistors (e.g., in the periphery circuitry) with different breakdown voltage (BV) requirements due to, for example, different voltage threshold (Vt) requirements and/or different channel widths, which can shift the acceptable implant dose concentration range to a higher value as the channel narrows. Having different BV requirements can mean different implant dose concentrations in, for example, the C2G and/or C2A regions of the transistors. Manufacturing devices in which the transistors require different implant dose concentrations can mean numerous implant steps (along with the associated masking) to ensure that each of the different transistors has an acceptable implant dose concentration. In addition, in some transistors, it can be beneficial to have different implant dose concentrations within different regions of the same transistor. For example, the implant dose concentration in the C2G region can be different than the implant dose concentration in the C2A region. Thus, in covenantal transistors, multiple steps may be needed to implant the required dopant concentration for each doped region. However, having multiple implant steps can mean that the efficiency of the fabrication process will be reduced and can increase the cost of the fabrication.

For the reasons stated above, and for other reasons stated below which will become apparent to those skilled in the art upon reading and understanding the present specification, there is a need in the art for limiting the number of different implant dose concentrations for fabricating a transistor device.

DETAILED DESCRIPTION

Figure 1A:
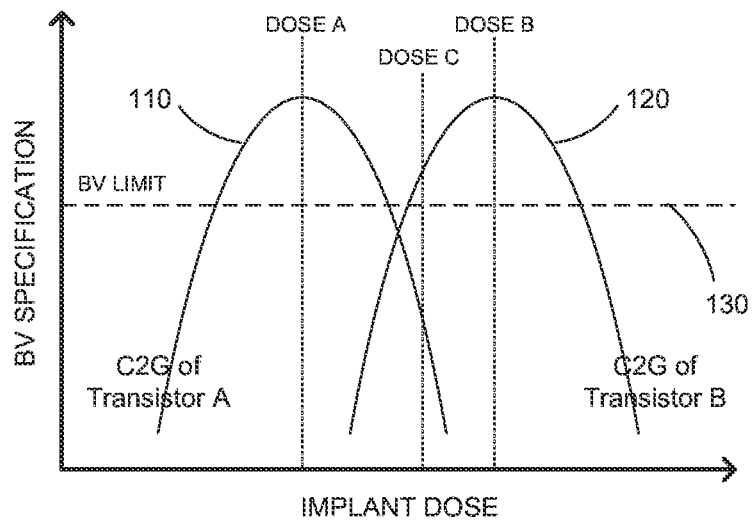
FIGS. 1A and 1B illustrate breakdown voltage curves for a contact-to-gate region of two transistors as a function of implant dose concentration.

Typically, certain regions of a transistor substrate can require doping (e.g., N- or P-doping) in order to change the electrical characteristic (e.g., resistance, breakdown voltage, etc.) of the substrate. For example, the C2G region(s) (source and/or drain) and/or the C2A region(s) (source and/or drain) can require a dopant implant (e.g., N-implant, P-implant, etc.) during fabrication of the transistor in order to provide conductivity and/or maintain a high BV for the region (e.g., above the acceptable BV limit). However, the implant dose concentration ("dose") in a same region (e.g., C2G region or C2A region) of different transistors can require different dopant concentration levels. For example, the C2G region of a transistor can require a higher dopant concentration than the C2G region of another transistor (similar situation for the C2A regions). The different transistors can be part of the same device (e.g., memory device) or part of different devices that are manufactured together. In addition, the dose in different regions of the same transistor can require different dopant concentration levels. For example, the C2G region can require a different (e.g., higher) dopant concentration level than the C2A region of the same transistor. There can be several reasons for doped regions to require different doses, such as, for example, reduced device width in some transistors (which requires higher dopant concentration in, e.g., the C2G region), use of a field plate in the C2G region in some transistors (which also requires a higher dose), etc. Thus, in related art systems, either a shared implant dose concentration that is within the respective acceptable implant dose concentration range for all the relevant transistors must be used or the manufacturing process must include additional implant steps with appropriate masks to account for transistor regions with different dopant concentration requirements. However, there is a desire to reduce cost by sharing an implant dose concentration (e.g., N-implant, P-implant, etc.) between regions (e.g., C2G, C2A, etc.) of different transistors and/or within a same transistor, even when the regions require different doses.

Embodiments of the present technology are directed to devices incorporating at least one implant screen in certain regions (e.g., C2G and/or C2A regions) of transistors such as, for example, high voltage field effect transistors. An "implant screen" as used herein means one or more features that block, at least partially, a dopant implant (e.g., an N-implant and/or a P-implant and/or other dopant). In some embodiments, the implant screen features can be formed as part of the gate polysilicon patterning step in the transistor fabrication process. The density of the implant screen features can correspond to the amount the BV curve will shift. For example, the greater the desired shift in the BV curve, the higher the required density of features (e.g., if the features are lines, then a higher line to space ratio). In some embodiments, the one or more features can be composed of, for example, polysilicon or some other appropriate material that blocks the dopant implant. In some embodiments, the one or more features are critical dimension features. A critical dimension feature includes and/or represents a smallest feature size (dimension) or geometrical article (e.g., lines, contacts, etc.) that can be formed (e.g., printed, present on a mask, etc.) based on the technology used during the manufacturing process. For example, if the feature is a line, the length and/or width of the line can be a critical dimension. Due to the configuration of the exemplary embodiments, as used herein, the term length of a feature (e.g., a line) is a measurement of the feature in the width direction of the transistor, the term width of a feature (e.g., a line) is a measurement the feature in the length direction of the transistor, and thickness of a feature (e.g., a line) is measurement of the feature in a direction that is perpendicular to a surface of the substrate. In some embodiments, the one or more features of an implant screen can be a line or lines (e.g., continuous and/or dashed line(s)). Alternatively, or in addition to line-shaped features, the implant screen can have features that have other shapes such as, for example, can be arc-shaped components, circular-shaped components, rectangular shaped components, and/or components having other types of shapes, including complex shapes, or any combination of the above. For clarity, exemplary embodiments of the present disclosure are discussed with respect to an implant screen in which the one or more features are lines. However, those skilled in the art understand the concepts described herein are applicable to implant screens with features having other shapes.

When an implant screen includes more than one line, the lines can have the same dimensions (thickness, width, and length) or the lines can have different dimensions (e.g., one or more of the thickness, width, or length can be different between one or more lines). In addition, the lines can have the same configuration (e.g., solid line, dashed line, straight line, angled line, curved line, C-shaped line, etc.) or different configurations. In addition, exemplary embodiments can include implant screens with one or more lines of a first configuration and one or more lines of a second configuration that is different from the first configuration. A transistor configured with an implant screen in accordance with the present disclosure can share a dose with one or more other transistors in a device (and/or with one or more transistors of other devices) and/or with different regions in the same transistor while meeting BV requirements in the respective regions (e.g., maintain the BV within acceptable limits).

As used herein, "applied implant dose concentration" or "applied dose" means a target dopant concentration for a region requiring the highest dopant concentration during a dopant implant step, and "effective implant dose concentration" or "effective dose" means the actual dopant concentration of a region after a dopant implant step using the applied dose. The effective dose in a region of the transistor can be equal to or less than the applied dose depending on whether an implant screen is used, for example.

In addition, in the following detailed description, reference is made to the accompanying drawings that form a part hereof, and in which is shown, by way of illustration, specific embodiments. In an exemplary embodiment, a device can include a substrate and a transistor disposed on the substrate. The transistor can include a source with a source contact disposed on the source. The transistor can also include a drain with a drain contact disposed on the drain. A gate can be disposed between the source contact and the drain contact, and a screened region can be disposed adjacent the source contact and/or a screened region can be disposed adjacent the drain contact. The screened region can correspond to a lightly doped region. The screened region can include an implant screen configured to reduce an effective dose in the screened region so as to shift an acceptable dose range of a dopant implant for the screened region to a higher dose range. For example, the implant screen can reduce the average dose level in breakdown path of the screened region (e.g., reduce the average dose level between the contact and gate for a C2G region or between the contact and active area edge for a C2A region). The acceptable dose range can correspond to acceptable breakdown voltage values for the screened region.

In another exemplary embodiment, a method of forming a device can include forming a first lightly doped region on a substrate, with the first lightly doped region having a first acceptable dose range for a dopant implant. The method can further include forming a second lightly doped region on the substrate, with the second lightly doped region having a second acceptable dose range for the dopant implant. The second acceptable dose range can have a higher dose range for the dopant implant than the first acceptable dose range. The method can also include doping the first and second lightly doped regions with the dopant implant during a same implant step. The method further including shifting the first acceptable dose range to overlap with the second acceptable dose range by reducing an effective dose in the first lightly doped region such that a shared dosage concentration is used for the dopant implant.

In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1A shows exemplary BV curves 110 and 120 that respectively show the change in the breakdown voltage (y-axis) of the C2G regions of transistors A and B as the implant dose concentration (x-axis) is increased in the respective C2G regions. In some embodiments, the BV curve corresponds to the electrically effective dose for the region and can be approximately the average implant dose concentration in the breakdown path. Transistors A and B can represent different transistors in a same device or transistors in different devices (e.g., devices formed during a same manufacturing process). The BV limit 130 (dotted line) can represent the acceptable BV limit for the C2G regions of transistors A and B with the BV values that are at or above the BV limit 130 being in an acceptable range. For clarity, the BV limit 130 is shown as being the same for both transistors, but the BV limits of the respective regions can be different in embodiments of the present disclosure. As seen in FIG. 1A, as the dose increases for each transistor A and B, the BV of the respective C2G regions (as shown by curves 110 and 120), will vary from an unacceptable BV range (below the BV limit 130) to an acceptable BV range (at or above the BV limit 130) and then back down to an unacceptable BV range. That is, too high or too low of an effective dose will result in too low of a BV value for the region. The optimal dose for the C2G region of transistor A with respect to BV is at the peak of curve 110, which corresponds to dose A, and the optimal dose for the C2G region of transistor B is at the peak of curve 120, which corresponds to dose B. However, while doses A and B can represent the optimal acceptable doses, other implant dose concentrations can be used so long as the BV values are within the acceptable range for the transistor. That is, the acceptable implant dose concentration range corresponds to acceptable breakdown voltage values for a C2G region. For example, the range of doses corresponding to the portion of each curve 110 and 120 that is at or above the BV limit 130 can represent an acceptable implant dose concentration range (also referred to herein as "acceptable dose range" or "ADR") for the respective C2G regions. Accordingly, in our example, dose C can be used for the C2G region of transistor B because dose C falls within the ADR for transistor B. However, dose C cannot be used for transistor A because it falls outside the ADR for transistor A.

In the example of FIG. 1A, the ADR for transistor A and the ADR for transistor B do not overlap. Without an overlap in the ADRs, there is no common acceptable dose that can be shared in the formation of the C2G regions of transistors A and B that will still satisfy the BV limit for the respective regions. If dose C is shared during a dopant implant step in the formation of conventional transistors A and B, the C2G regions of each transistor A and B will be at a dopant concentration corresponding to dose C after the dopant implant step. For example, if dose C corresponds to $6 \times 10^{12}$ atoms/cm$^2$, then the C2G regions of both transistors A and B will have a dopant concentration of $6 \times 10^{12}$ atoms/cm$^2$. While the BV value corresponding to dose C for transistor B is within acceptable limits, the BV value corresponding to dose C for transistor A falls below the BV limit 130 because the dopant concentration will be too high in the C2G region of transistor A. Accordingly, when manufacturing conventional transistors that do not have overlapping ADRs, separate dopant implant steps will be required along with appropriate masks, which can be uneconomical. The issues with respect to the C2G regions discussed above can be similar for other regions as well, such as, for example, the C2A regions of different transistors.

In exemplary embodiments of the present disclosure, a transistor can include a region with an implant screen such that an applied dose can be shared between the transistor and one or more other transistors and/or the applied dose can be shared with another region of the same transistor during a same dopant implant step. The implant screen can be configured such that an effective dose of the relevant region corresponds to a predetermined value that is equal to or less than the applied dose. In some embodiments, the predetermined value is less than the applied dose. In some embodiments, the predetermined value corresponds to a BV value that is above the BV limit 130 for the relevant region. In some embodiments, the applied dose value and/or the effective dose value can correspond to an average dopant concentration in the region, and/or be based on a BV value of the region and/or be based on a property of the region, such as, for example, the resistance. In some embodiments, a transistor can be configured such that an effective dose in a region of the transistor is less than the applied dose. The effective dose can be a value corresponding to a dopant distribution that is uniformly distributed in the region, but the actual dopant distribution need not be uniform. For example, if a uniformly distributed dose of $6 \times 10^{12}$ atoms/cm$^2$ corresponds to a BV of 25 volts, then a non-uniformly distributed dose within the region that has a BV of 25 volts will also have an effective dose of $6 \times 10^{12}$ atoms/cm$^2$ (after adjusting for which side of the BV curve the effective dose would fall on). This means that the actual implant distribution within the region can vary from the target dose level to nearly a zero dose level.

Figure 1B:
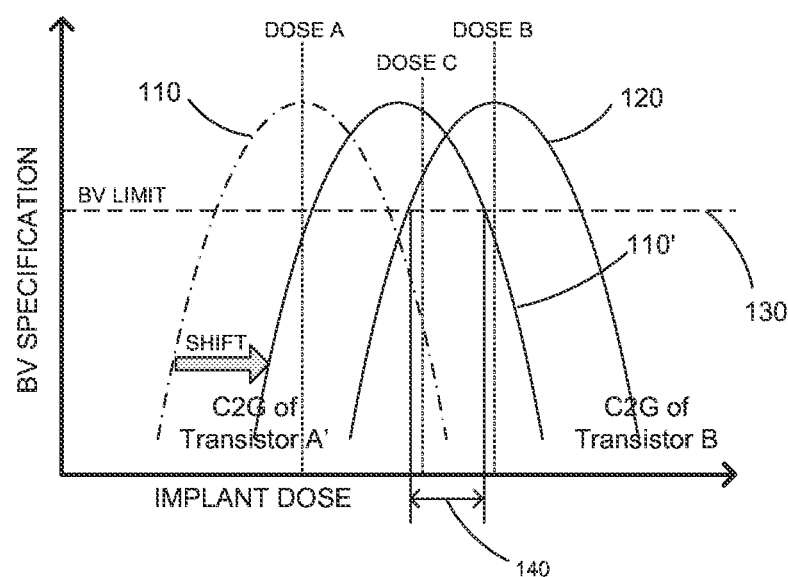

FIG. 1B shows exemplary BV curves for C2G regions of transistor A' and transistor B. Transistor A' can include an implant screen in accordance with an embodiment of the present disclosure as discussed below. Transistor A' can be the same as transistor A but with an implant screen added to one or both C2G regions of transistor A. The implant screen is configured such that the effective dose in the C2G region(s) of transistor A' is less than the applied dose. Thus, the effect of including an implant screen in a transistor is to shift the ADR higher. For example, as seen in FIG. 1B, in comparison to the BV curve 110 (now shown as a dot-dash line) for transistor A, the BV curve 110' for transistor A' is shifted closer to the BV curve 120 for transistor B. By shifting the BV curve for the C2G region of transmitter A', the ADR of transistor A' overlaps with the ADR of transistor B as shown by overlap range 140. The overlap range 140 represents a range of shared dose values that can be used in the dopant implant step for the C2G regions of both transistors A' and B. For example, dose C can be used as a shared (or common) applied dose for a dopant implant step in the fabrication of transistors A' and B. However, because transistor A' has an implant screen and transistor B does not, even though the applied dose is shared, the effective dose in the C2G region of transmitter A' will be lower than the effective dose (e.g., the applied dose) of the C2G region of transistor B. For example, if applied dose C is $6 \times 10^{12}$ atoms/cm$^2$, then the effective dose in transistor B can match the applied dose because transistor B has no implant screen, but the effective dose of transistor A' can be, for example, a value lower than $6 \times 10^{12}$ atoms/cm$^2$ that still provides a BV within an acceptable range (e.g., $3 \times 10^{12}$ atoms/cm$^2$ or some other lower value). The effect of the implant screen in transistor A' is that its effective dose will be approximately the same as that for transistor A after a separate lower applied dose is used. In some embodiments, the implant screen is configured such that the effective dose of the screened region corresponds to a predetermined BV value for the region. The predetermined BV value can be, for example, a BV value within the acceptable BV range for the region such as, for example, the peak BV value for the region. In exemplary embodiments of the present disclosure, the applied dose can be in a range from $2 \times 10^{12}$ atoms/cm$^2$ to $8 \times 10^{12}$ atoms/cm$^2$, such as for example, $3 \times 10^{12}$ atoms/cm$^2$ to $7 \times 10^{12}$ atoms/cm$^2$, and/or $4 \times 10^{12}$ atoms/cm$^2$ to $6 \times 10^{12}$ atoms/cm$^2$. The effective dose can be in a range from $1 \times 10^{12}$ atoms/cm$^2$ to $5 \times 10^{12}$ atoms/cm$^2$, such as for example, $2 \times 10^{12}$ atoms/cm$^2$ to $4 \times 10^{12}$ atoms/cm$^2$, and/or approximately $3 \times 10^{12}$ atoms/cm$^2$.

As discussed above, by including an implant screen for certain regions of a transistor, the ADR for a transistor can be shifted such that its ADR overlaps with the ADR of a transistor requiring a higher ADR (e.g., transistor B in the above scenario). In some embodiments, the higher ADR transistor can be a transistor that requires a highest implant dose concentration, which can be, for example, the shared applied dose. In some embodiments, the implant screen shifts the ADR of the screened transistor such that a peak BV of the screened ADR is below a peak BV of the higher ADR. In some embodiments, the peak BV of the screened ADR is shifted to match the peak BV of the higher ADR, and in other embodiments, the peak BV of the screened ADR is shifted to be above the peak BV of the higher ADR.

Figure 2A:
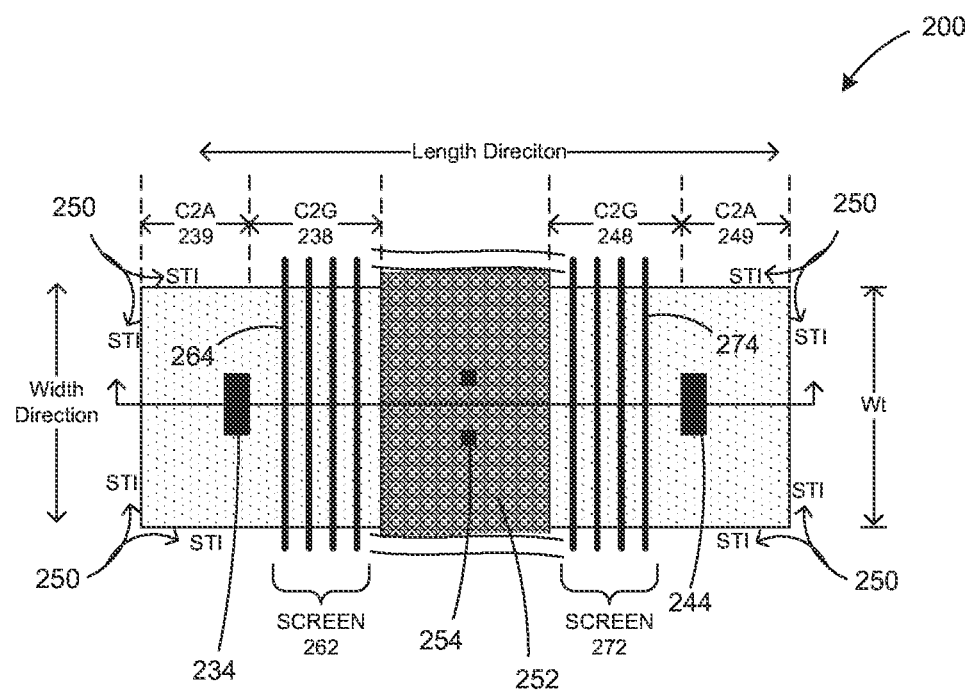
FIGS. 2A and 2B illustrate a top plan view and a cross-sectional view of a transistor with implant screens in the contact-to-gate regions in accordance with the present disclosure.
Figure 2B:
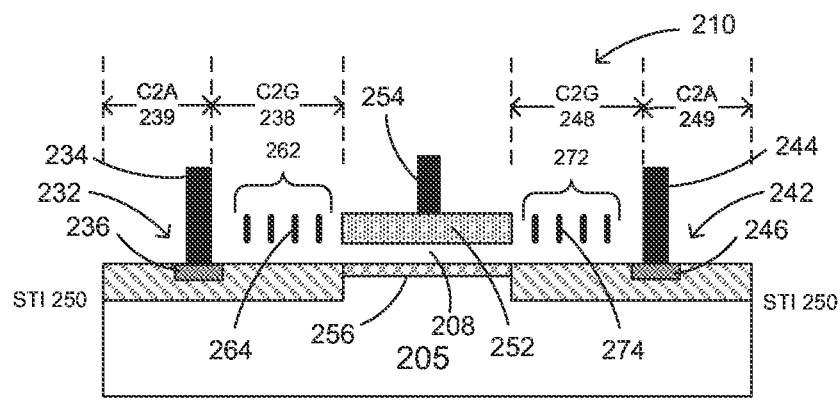
Figure 4A:
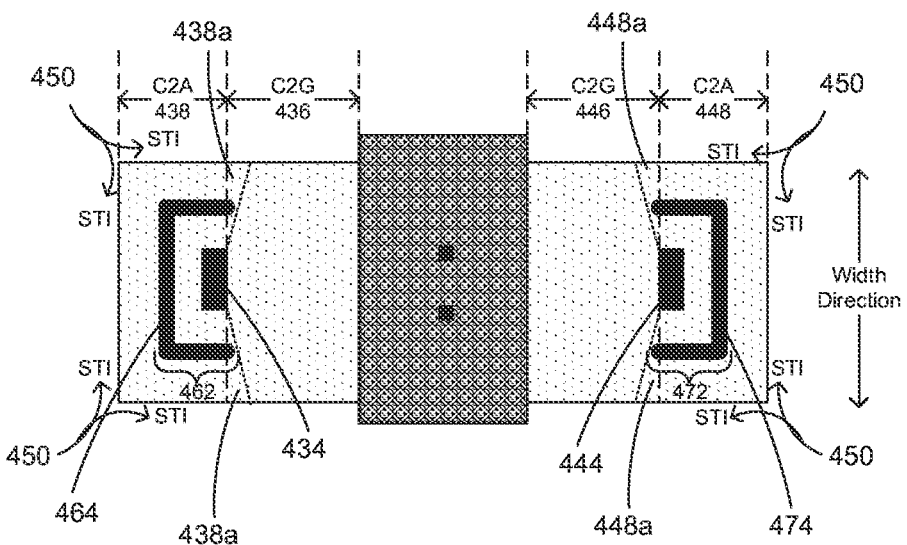
FIG. 4A illustrates a top plan view of a transistor with implant screens in the contact-to-active area edge regions in accordance with the present disclosure.

As discussed above, to lower the effective dose of a C2G region of a transistor, the C2G region can include an implant screen. For example, FIGS. 2A and 2B illustrate simplified top and cross-sectional views of an exemplary embodiment in which the C2G regions of a transistor can have implant screens. Device 200 can include at least one transistor 210 (e.g., a high voltage transistor) that is formed on a substrate 205, which can be composed of silicon. Although only one transistor is illustrated in FIGS. 2A and 2B for clarity, device 200 can have one or more transistors. In addition, although the transistor 210 is described herein as being formed or disposed on the substrate 205, those skilled in the art understand that portions of the transistor 210 can be formed in the substrate 205 and portions of the transistor 210 can be formed on the substrate 205. In the example of FIGS. 2A and 2B, the substrate 205 can be a p-type substrate, but in other embodiments, the substrate can be an n-type substrate. The type of substrate can depend on the type of transistor (e.g., NMOS or PMOS). For brevity, an NMOS transistor is discussed but embodiments of the present disclosure can also be applicable to PMOS transistor technology. As seen in the cross-sectional view of FIG. 2B, an NMOS transistor 210 is deposited on the p-type substrate 205. The NMOS transistor 210 includes a source 232 defined by an n+ diffusion layer 236 and a drain 242 defined by n+ diffusion layer 246. One or more metal layers (e.g., a tungsten layers) can be disposed on the source 232 to create a source contact 234. One or more metal layers (e.g., a tungsten layers) can be disposed on the drain 242 to create a drain contact 244. In some embodiments, a lightly doped region can be formed between the gate and one or both of the source contact and drain contact and/or a lightly doped region can be formed between one or both of the source contact and drain contact and the respective active area edge. For example, as seen in FIG. 2A, a source C2G region 238 can be disposed between the source contact 234 and the gate 252, and a drain C2G region 248 can be disposed between the drain contact 244 and the gate 252. Similarly, a source C2A region 239 can be disposed between the source contact 234 and the active area edge (e.g., defined by the border the shallow trench isolation (STI) region 250), and a drain C2A region 249 can be disposed between the drain contact 244 and the active area edge defined by the STI 250. As shown in FIG. 4A, the boundary between the C2A regions 239,249 and the C2G region 238,248 is approximately aligned with the gate side of the respective contact 234,244. As discussed further below, the C2G regions 238 and 248 and C2A regions 239 and 249 can be lightly doped so as to form lower conductivity regions in comparison to the more heavily doped high conductivity n+ regions of the source 232 and drain 242. In some embodiments, a channel 256 can be disposed under the gate 252. At least a portion of channel 256 can be doped to have a different (e.g., higher) conductivity than that of the p-type substrate 205 such that the channel 256 will have a desired threshold voltage (Vt). The gate 252 can be comprised of one or more layers of polysilicon and/or WSix (tungsten silicide) that are disposed on top of the silicon oxide layer 208. One or more metal layers (e.g., a tungsten layers) can be disposed on the gate 252 to serve as an input contact 254 to the transistor. At least a portion of the C2G and C2A regions of the transistor 210 can be defined by an active area edge bordering the STI region 250 surrounding the C2G and C2A regions. For example, opposing sides of the C2G region in a width direction of the transistor 210 can be defined by an active area/STI edge boundary line. For the C2A regions, opposing sides of the C2A region in a width direction of the transistor 210 and the side away from the contact in the length direction can be defined by an active area/STI edge boundary line. In some embodiments, the source 232 can be connected to ground potential GND via the source contact 234, and the drain 242 can be connected to a high voltage source via the drain contact 244. The high voltage source can be, for example, in a range of 10 to 35 volts, depending on the function of the transistor 210.

As seen in FIGS. 2A and 2B, the C2G regions 238 and 248 each have respective implant screens 262 and 272. The implant screen 262 includes one or more reticle lines 264, and the implant screen 272 includes one or more reticle lines 274. In some embodiments, the reticle lines 264, 274 can be composed of polysilicon but other appropriate materials that can block the dopant implant (e.g., an N-implant and/or a P-implant and/or another dopant) can be used. The number of lines, the type (e.g., solid, dashed, etc.) and shape (e.g., straight, curved, angled, zig-zag, etc.) of the lines, and/or location where the lines are disposed can be based on the amount of reduction in the surface area of the C2G region that is required by the implant screen to achieve the desired reduction in the effect dose for a given applied dose. In some embodiments, the reticle lines 264, 274 are oriented in the width direction of the transistor 210 as shown in FIGS. 2A and 2B. However, in other embodiments, the lines can be oriented differently, such as, for example, in the length direction and/or at another angle.

In some embodiments, the effective dose reduction corresponds to a ratio ("effective dose reduction ratio" or "EDR ratio") between the exposed surface of the implant region (e.g., C2G, C2A, etc.) to a total surface area of the implant region. The exposed substrate surface corresponds to the portion not under the features (e.g., polysilicon lines) of the implant screen. In some embodiments, the implant screen can have an EDR ratio that is less than 1. In some embodiment, when discontinuity is allowed, the EDR ration can be below 0.3. However, if continuity is required, the minimum EDR ratio is 0.5 when using features and spacing having a critical dimension, as discussed below. In some embodiments, the EDR ratio can be in a range from 0.2 to <1, such as for example, from 0.5 to <1. Thus, the effective dose will be equal to the applied dose times the EDR ratio. As an example, if the effective dose is required to be $5 \times 10^{12}$ atoms/cm$^2$ and the shared applied dose is be $8 \times 10^{12}$ atoms/cm$^2$, the implant screen for the region can be configured to have an EDR ratio of 0.625 in order in order to achieve a BV in the acceptable range. By using an implant screen, a shared applied dose (e.g., at $8 \times 10^{12}$ atoms/cm$^2$ in the above example) can be used for transistor regions requiring different effective doses while ensuring that the drive current of the transistor with the implant screen matches or nearly matches the drive current of a similar transistor manufactured without an implant screen and using an unshared applied dose (e.g., at $5 \times 10^{12}$ atoms/cm$^2$ in the above example).

In the embodiment of FIGS. 2A and 2B, the dopant implant window is open immediately adjacent the gate 252. That is, the surface of the C2G region immediately adjacent the edge of gate 252 can receive a dopant implant. However, in other embodiments, a reticle line 264,274 can be disposed immediately adjacent the edge of gate 252 so that the dopant implant window is offset away from the gate edge by the width W of the reticle line 264, 274. This is because the reticle line 264, 274 blocks the dopant implant immediately adjacent the edge of the gate 252 and the dopant implant window opens only after the adjacent reticle line 264, 274. By having the dopant implant window offset away from the edge of gate 252 by a width W of the reticle line 264,274, in some embodiments, the BV performance can be improved due to reduced electromagnetic forces at the gate edge-C2G interface in comparison to an embodiment where the dopant implant window is open immediately adjacent the gate 252.

Figure 2C:
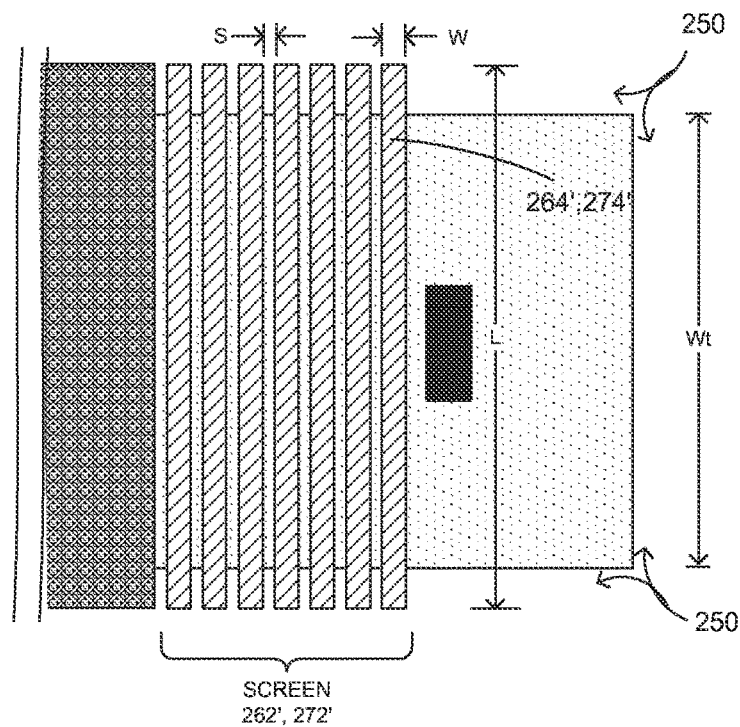
FIGS. 2C to 2E illustrate partial top plan views of various embodiments of implant screens for a contact-to-gate region in accordance with the present disclosure.

In some embodiments, a width W of the reticle line (see, e.g., FIG. 2C and reticles lines 264',274') and/or a spacing S between reticle lines can be adjusted such that the required effective dose for an acceptable BV value is achieved. For example, the width W of a reticle line can be 0.04 µm or greater. The upper limit of the width W is dependent on whether discontinuity in the diffused implant under the feature is allowed. In some embodiment, the width W can be in a range of 0.04 µm to 0.15 µm. The spacing S between adjacent reticle lines can be 0.04 µm or greater. In some embodiments, the spacing S can be in a range of 0.04 µm to 1 µm. In some embodiments, the length L of the reticle line 264, 274 equals $w_t$, where $w_t$ is the width of the transistor. However, in other embodiments, the length can be less than $w_t$. In some embodiments, at least one end of the reticle line 264,274 can extend into the STI region 250, and, in some embodiments, both ends of the reticle line 264,274 can extend into the STI region 250. However, although features such as reticle lines 264,274 can extend into the STI region 250, the effective dose is reduced based on the portion of the feature within the doped region (e.g., C2G region, C2A region, etc.) As an example, in order to reduce the effective dose to approximately $3 \times 10^{12}$ atoms/cm² from an applied dose of $8 \times 10^{12}$ atoms/cm², an implant screen can be configured to have an EDR ratio of 0.375. As seen in FIG. 2C, exemplary implant screens 262', 272', which can correspond to the implant screens 262, 272 discussed above, can have seven reticle lines 264', 274', respectively, which extend into the STI region 250 (for clarity only one C2G is shown). In the embodiment of FIG. 2C, each C2G region has a total surface area equal to 1.12 µm×$w_t$. Each of the reticle lines 264',274' can have a width W of 0.1 µm and a spacing between adjacent reticle lines can be 0.05 µm. Because only the length of the reticle lines that are within the C2G region count, the corresponding blocked surface area will then be equal to (0.7 µm×$w_t$). With such a configuration, the ratio of the exposed surface area to the total surface area of the C2G region will be 0.375 and the effective dose will be approximately $3 \times 10^{12}$ atoms/cm² when an applied dose of $8 \times 10^{12}$ atoms/cm² is used in the dopant implant step. The exposed surface area is the portion of the lightly doped region (e.g., C2G region, C2A region, etc.) not covered by a feature (e.g., the reticle lines), and total surface area is the surface area of the lightly doped region (e.g., C2G region, C2A region, etc.).

In some embodiments, the width W of a reticle line 264, 274 can be as small as the critical dimension of the equipment used to create the line. For example, for a 193 nm dry process, the minimum line width W can be 0.06 µm, but a width of 0.75 µm is more practical. Depending on the wavelength of photolithography technology process that is used, the polysilicon gate mask allows for a small line/space pattern in the C2G region in comparison to the C2A region. For example, in some embodiments, the critical dimension can be approximately 230 nm for a 365 nm wavelength process, approximately 90 nm for a 248 nm wavelength process, approximately 60 nm for 193 nm wavelength dry process, and approximately 40 nm for a 193 nm wavelength immersion process. In contrast, the critical dimension for C2A region is approximately 300 nm to 500 nm. In some embodiments, when the reticle lines are at the critical distance, the spacing S between the lines can be the primary means to adjust the effective dose reduction ratio. In some embodiments, additional reductions in the effective dose can be achieved using STI slots in the implant region (e.g., C2G region). The STI slots can be, for example, slot-shaped openings in the active-area of the implant regions (e.g., C2G regions). That is, the STI slots are "STI islands" in the active area. Of course, STI shapes other than slot-shapes can be used. Additional reduction in the effective dose can also be achieved using a field plate over a portion of the implant region.

Figure 2D:
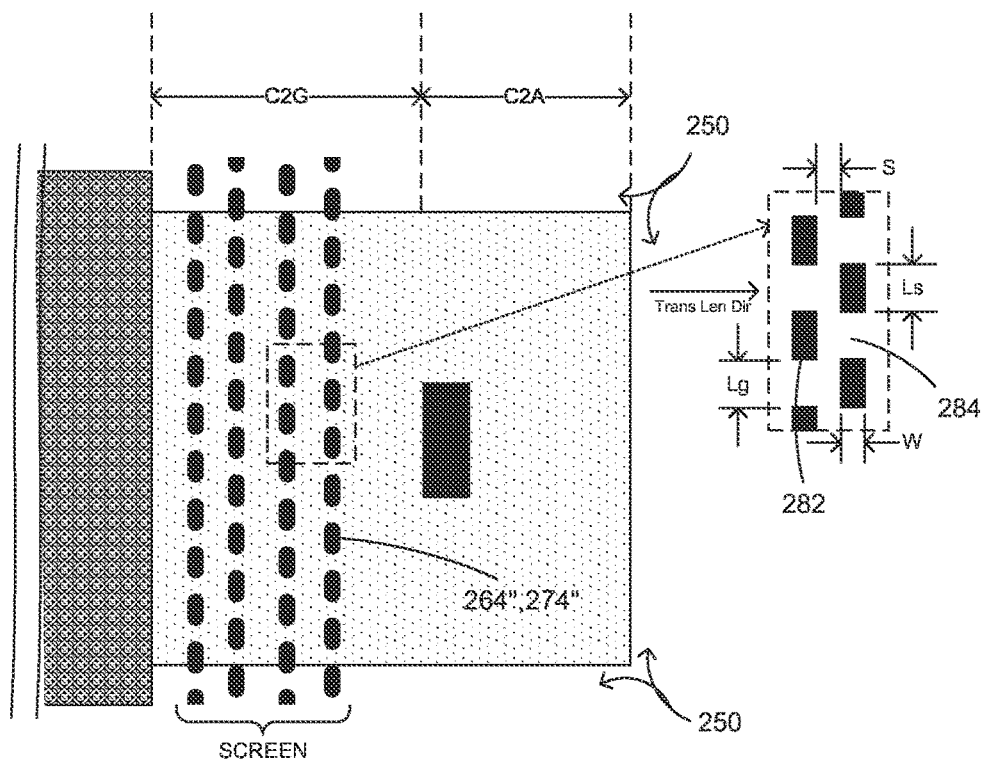

In some embodiments, the width of the feature (e.g., reticle line) is kept as close as possible to the critical distance to help ensure that the dopant will diffuse under the feature so as to keep continuity of the implant in the region, which ensures there is electrical continuity. If the width of the line is too large, there can be a break in the implant continuity created by the implant dose because the implant will not diffuse under the feature. In such cases, the portion of the C2G region outside the discontinuity can become electrically floating. When thin features are not possible and/or to further ensure there is continuity of the diffused implant, the implant screen can include one or more discontinuous features such as, for example, dashed lines to minimize or eliminate implant discontinuity. In some embodiments, as seen in FIG. 2D, implant screens 262",272", corresponding to the C2G regions of a transistor, can include one or more pairs of dashed lines 264",274". As seen in the expanded portion (dotted box), each dashed line 264", 274" can include a solid portion 282 and a gap portion 284, with each pair of lines 264", 274" separated by a spacing S. In some embodiments, each pair of dashed lines 264", 274" can be the equivalent of one solid line with respect to dopant implant blocking capability. In some embodiments, the pair of dashed lines 264",274" can be offset with respect to each other such that a solid portion 282 of a dashed line is aligned with a gap portion 284 of an adjacent dashed line. In some embodiments, the alignment is such that there is no gap in the pair of dashed lines 264",274" when viewed along the length direction of the transistor (see arrow). The combination of the gap portions 284 and spacing S between the dashed lines 264",274", ensures that there will always be implant continuity (e.g., in a zig-zag pattern). Thus, the need to have complete lateral implant diffusion under each feature of the implant screen is less of a concern in this embodiment. In some embodiments, the length Ls of the solid portions 282 can be equal to the length Lg of the gap portions 284. In other embodiments, the length Ls of the solid portions 282 can be greater than or less than the length Lg of the gap portions 284. In some embodiments, the dimensions of the solid portions 282 within each line and/or the dimensions of the gap portions 284 within each line can be same, e.g., Lg equals Ls within each line. In some embodiments, at least one solid portion 282 can have a different dimension than other solid portions 282 within a dashed line 264",274" and/or at least one gap portion 284 can have a different dimension than other gap portions 284 within a dashed line 264",274". The width W of the solid portions 282 can be 0.04 µm or greater. In some embodiments, the width W of the solid portions 282 can be in a range of 0.04 µm to 0.15 µm and the length Ls of the solid portions 282 and gap portions 284 can be in a range of 0.2 µm to 0.4 µm.

Figure 2E:
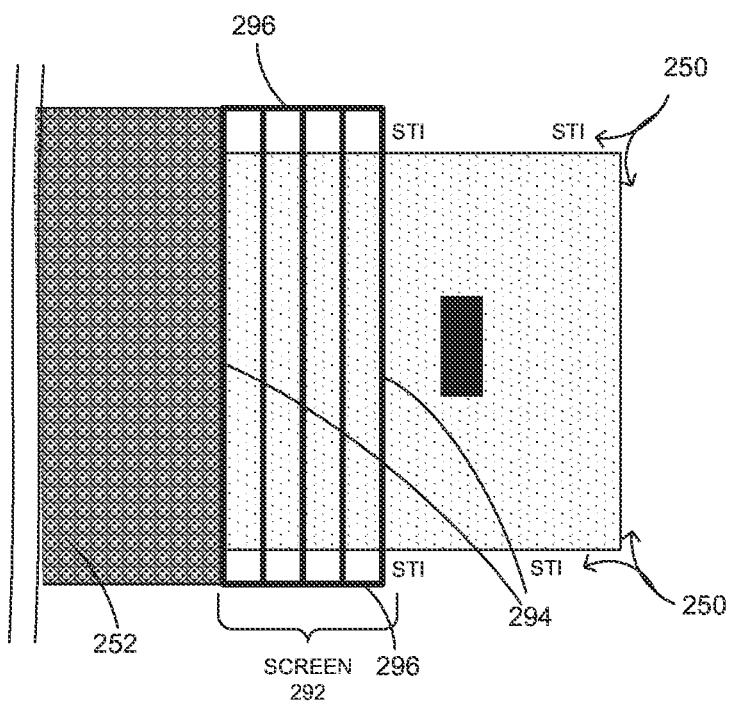

In some embodiments, the features (e.g., reticle lines 264,274) of the implant screen (e.g., screen 262,272) can be floating. That is, as seen in FIGS. 2A and 2B, the reticle lines 264,274 of respective implant screens 262,272 are not electrically connected to the gate 252, the source 232, the drain 242, or to any other ground or power source. Thus, because there is no electrical connection between the gate 252 and reticle lines 264,274, any induced voltage on the reticle lines 264,274 is allowed to float. However, in other embodiments, for example as seen in FIG. 2E, the features (e.g., reticle lines 294) of the implant screen 292 are connected to gate 252. For example, in some embodiments, the features can be connected to the gate 252 by one or more connection layers 296. The connection lines can be, for example, polysilicon layers. In some embodiments, for example as seen in FIG. 2E, the connection lines 296 can be formed in the STI region 250 of the C2G region of the transistor. However, the connection layer(s) can also be formed in the active area of the C2G in some embodiments. In such cases, the area of the connection layers needs to be taken into account when determining the reduction in the effective dose. By connecting the implant screen 292 to the gate 252, the implant screen 292 acts as a "shutter" field plate. That is, a field plate that is slotted rather than solid. The shutter field plate 292 can provide enhanced depletion effect when the gate 252 is grounded or at a low voltage and enhanced conduction effect when the gate is at high voltage. In some embodiments, the shutter field plate can be connected to the drain 242 or the source 232. In some embodiments, an implant screen 292 acting as a shutter field plate can be formed over a thick oxide later (e.g., 200 Å to 500 Å). When the implant screen is configured to be floating, the features can be formed over a thin oxide layer (e.g., 200 Å to 500 Å) or over a thin oxide layer (e.g., 10 Å to 80 Å).

Figure 3A:
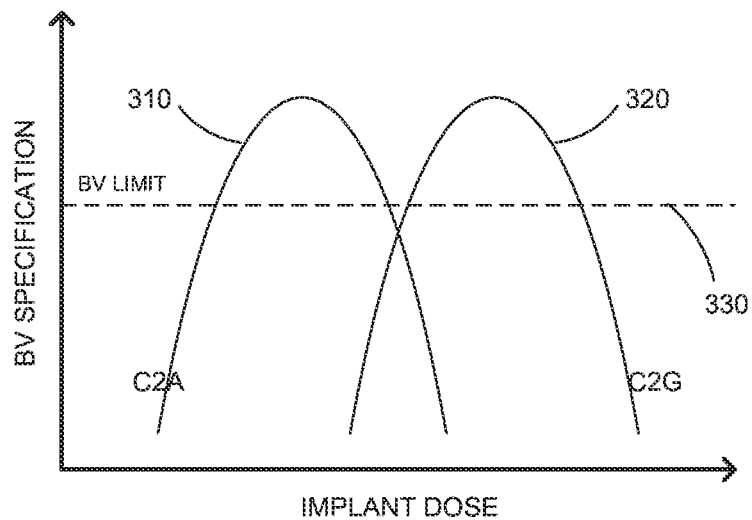
FIGS. 3A and 3B illustrate breakdown voltage curves for a contact-to-gate region and a contact-to-active area edge region of a transistor as a function of implant dose concentration.

In the above discussions, exemplary embodiments of the present disclosure were mainly directed to sharing an applied dose between regions of different transistors that require different effective doses. However, embodiments of the present disclosure are not limited to sharing an applied dose between regions of different transistors. In some embodiments, a transistor can be configured to share an applied dose between different regions of a same transistor, such as for example between the C2A and C2G regions. FIG. 4A illustrates BV curves 310 and 320 that respectively show the change in the breakdown voltage (y-axis) of the C2A region and C2G region of a same transistor as the implant dose concentration (x-axis) is increased in the respective regions. In some embodiments, the BV curve corresponds to the electrically effective dose for the region and can be approximately the average implant dose concentration in the breakdown path. As seen in FIG. 3A, the C2G region can require a higher effective dose than the C2A region. The higher implant dose concentration requirement (e.g., a higher N-dose) can be due to, for example, reduced device width which increases the dopant implant requirement in the C2G region, use of a field plate in the G2G region, and/or, as discussed above, the C2G region having to reduce its effective dose because of a shared applied dose with other transistors and/or devices. The BV limit 330 (dotted line) can represent the acceptable BV limit for the C2G and C2A regions of the transistor with the BV values that are at or above the BV limit 330 being in an acceptable range. For clarity, the BV limit 330 is shown as being the same for both regions, but the BV limits of the regions can be different in embodiments of the present disclosure. Those skilled in the art will see that the interpretation of the BV curves of FIG. 3A, the BV limit, and the applied dose as it relates to the ADR for each region is similar to that given above with respect to FIG. 1A and thus, for brevity, further discussion is omitted. As seen in FIG. 3A, there is no common implant dose concentration that can be shared by the C2G and C2A regions of the transistor. Accordingly, similar to the situation discussed above with respect to different transistors, when manufacturing a conventional transistor that does not have overlapping ADRs for regions within the transistor, separate dopant implant steps will be required along with appropriate masks, which can be uneconomical.

In exemplary embodiments of the present disclosure, a transistor can include a region (or regions) with an implant screen such that an applied dose can be shared between different regions of the same transistor. For example, the C2A region(s) of a transistor can include an implant screen such that an application dose directed to the C2G region(s) can also be shared by the C2A region(s). In exemplary embodiments, the implant screen can be configured such that an effective dose of the screened transistor region corresponds to a predetermined value that is equal to or less than the applied dose. In some embodiments, the predetermined value is less than the applied dose. In some embodiments, the predetermined value corresponds to a BV value that is above the BV limit 330 for the screened region, with the BV values that are at or above the BV limit 330 being in an acceptable range. Similar to the embodiments discussed above, in some embodiments, the applied dose value and/or the effective dose value can correspond to an average dopant concentration in the respective region, and/or be based on a BV value of the respective region and/or be based on a property of the respective region, such as, for example, the resistance. In addition, the effective dose can be a value corresponding to a dopant distribution that is uniformly distributed in the region, but the actual dopant distribution need not be uniform, as discussed above.

Figure 3B:
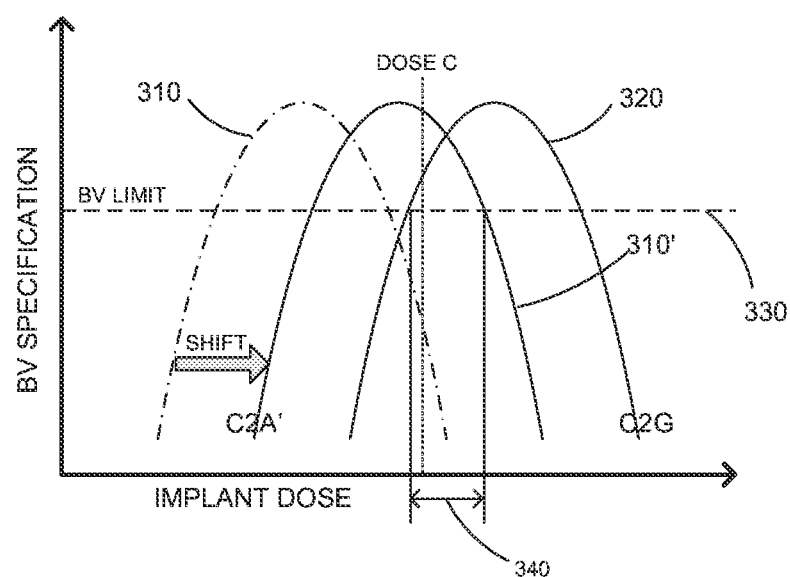

FIG. 3B discloses BV curves for the C2A' region(s) and the C2G region(s) of a transistor. The C2A' region(s) can include an implant screen in accordance with an embodiment of the present disclosure. C2A' region(s) can be the same as a C2A region(s) od FIG. 3A but with an implant screen added to the region. The implant screen is configured such that the effective dose in the C2A' region(s) is less than the applied dose (e.g., the implant dose concentration used for the C2G region). Thus, similar to the above embodiments, the effect of including an implant screen in the C2A' region(s) is to shift the ADR higher. For example, as seen in FIG. 3B, in comparison to the BV curve 310 (now shown as a dot-dash line) for C2A region(s), the BV curve 310' for the C2A' region(s) is shifted closer to the BV curve 320 for the C2G region(s). By shifting the BV curve for the C2A' region(s), the ADR of the C2A' region(s) overlaps with the ADR of C2G region(s) as shown by overlap range 340. The overlap range 340 represents a range of shared dose values that can be used in the dopant implant step for the C2A' and C2G regions of a transistor. For example, dose C can be used as a shared (or common) applied dose for a dopant implant step in the fabrication of the C2A' and C2B regions of the transistor, and the implant screen for the C2A' region can reduce the effective dose as discussed above. In some embodiments, the implant screen is configured such that the effective dose of the screened region corresponds to a predetermined BV value for the region. The predetermined BV value can be, for example, a BV value within the acceptable BV value for the region such as, for example, the peak BV value for the region. In exemplary embodiments of the present disclosure, the applied dose for the C2A region(s) with an implant screen can be in a range from $2\times10^{12}$ atoms/cm$^2$ to $8\times10^{12}$ atoms/cm$^2$, such as for example, $3\times10^{12}$ atoms/cm$^2$ to $7\times10^{12}$ atoms/cm$^2$, and/or $4\times10^{12}$ atoms/cm$^2$ to $6\times10^{12}$ atoms/cm$^2$. The effective dose for the C2A region(s) with an implant screen can be in a range from $1\times10^{12}$ atoms/cm$^2$ to $5\times10^{12}$ atoms/cm$^2$, such as for example, $2\times10^{12}$ atoms/cm$^2$ to $4\times10^{12}$ atoms/cm$^2$, and/or approximately $3\times10^{12}$ atoms/cm$^2$. The ADR for the C2A region(s) can be shifted such that the C2A ADR overlaps with the ADR of the C2G region(s) of the transistor. Based on the configuration, the implant screen of the C2A' region can shift the ADR such that a peak is below the peak of the C2G ADR, matches the peak of the C2G ADR, or is above the peak of the C2G ADR.

As seen in curves 310 and 320, the acceptable dopant concentrations in the C2A regions and C2G regions can be different. As shown in FIG. 4A, the boundary between the C2A region 438,448 and the C2G region 436,446 is approximately aligned with the gate side of the respective contact 434,444. The other boundaries defining the C2G regions 436,446 and C2A regions 436,446 are also similar to that given above for C2G regions 238,248 and C2A regions 239,249 (e.g., with respect to the contact, gate edge, and the active area/STI edges). However, in some embodiments, the C2A region can include an extended region that extends toward the gate and lateral to the contact, as shown by references 438a and 448a. For clarity, the C2A region is discussed generally without explicit reference to extension region 438a,448a, but the discussion is also applicable to embodiments that include the extension region 438a,448a. As discussed above, to lower the effective dose of a C2A region(s) of a transistor, the C2A region(s) can include implant screens. For example, FIG. 4A illustrates a simplified top view of an exemplary embodiment in which the C2A regions of a transistor can have implant screen. Those skilled in the art will recognize that transistor 410 is similar to the transistor 210 discussed above with respect to FIGS. 2A and 2B, with the main difference being that the implant screens are in the C2A regions instead of the C2G regions. Thus, for brevity, only the portions of the transistor 410 related to the implant screens 462,472 will be discussed. In some embodiments, a lightly doped region can be interposed between the source contact 434 and the active area edge in the source C2A region 438. In addition, a lightly doped region can be interposed between the drain contact 444 and the active-area edge in the drain C2A region 448. Similar to the C2G regions 238,248, the C2A regions 438 and 448 can be lightly doped so as to form lower conductivity regions in comparison to the more heavily doped high conductivity n+ regions of the source and drain.

As seen in FIG. 4A, the C2A regions 438 and 448 each have respective implant screens 462 and 472. The implant screens 462,472 can include features that can be a single line or a series of continuous lines or a series of dashed lines surrounding the contact (e.g., completely or partially). In some embodiments, the feature in the implant screen 462, 472 can be centered between the contact and the active area edge boundary with the STI region 250. Similar to the features in the C2G region, the C2A features block the dopant implant (e.g., an N-implant and/or a P-implant and/or another dopant) to reduce the effective dose in the breakdown path between the contact to the edge of the active area, which causes the ADR to shift towards a higher ADR. For example, each of the implant screens 462 and 472 respectively includes one or more reticle lines 464 and 474. In some embodiments, the reticle lines 464, 474 can be disposed between the contacts 434,444 and the edge of the respective active areas within each C2A region 438,448. In some embodiments, the reticle lines 464, 474 can be composed of polysilicon but other appropriate materials that can block the dopant implant can be used. The number of lines, the type (e.g., solid, dashed, etc.) and shape (e.g., straight, curved, angled, zig-zag, etc.) of the lines, and/or location where the lines are disposed can be based on the amount of reduction in the surface area of the C2A region that is required by the implant screen to achieve the desired reduction in the effect dose for a given applied dose. In some embodiments, the reticle lines 464, 474 of the implant screens 462, 472 have a configuration in which a portion of the reticle line 464, 474 is parallel to the width direction of the transistor and one or more portions are perpendicular to the width direction such as, for example, a "C-shaped configuration". In some embodiments, the implant screen with a C-shaped configuration can be arranged such that the open portion of the "C" is oriented toward the C2G region. In some embodiments, the implant screen is disposed such that the contacts 434, 444 are located in the middle of the C-shaped configuration such that the lines 4674, 474 are disposed between the contacts 434,444 and the edge of the respective active areas within each C2A region. In some embodiments, there can be multiple lines with C-shaped configurations arranged in a parallel configuration (e.g., an inner C-shaped line surrounding the contact and one or more outer C-shaped lines surrounding the inner line or one or more of the outer lines). In some embodiments, one or both of the implant screens can have a configuration that is different from a C-shaped configuration.

In some embodiments, a width of the feature (e.g., reticle line) and/or a spacing between features (if applicable) and/or length of a feature can be adjusted such that the required effective dose for an acceptable BV value is achieved. For example, the width of a reticle line can be 0.04 μm or greater. In some embodiments, the width W can be in a range of 0.04 μm to 0.15 μm. The spacing between adjacent reticle lines can be 0.04 μm or greater. In some embodiments, the spacing S can be in a range of 0.04 μm to 1 μm. In some embodiments, the length of feature in the width direction of the transistor is equal to or less than the width of the transistor. In some embodiments, the feature (e.g., reticle line) can extend into the STI region 450. However, although the feature can extend into the STI region 450, the effective dose is reduced based on the portion of the feature within the doped region (e.g., C2A region). In some embodiments, the implant screen 462, 472 can have an EDR ratio that is less than 1. In some embodiment, when discontinuity is allowed, the EDR ration can be below 0.3. However, if continuity is required, the minimum EDR ratio is 0.5 when using features and spacing having a critical dimension. In some embodiments, the EDR ratio can be in a range from 0.2 to <1, such as for example, from 0.5 to <1. By using an implant screen, a shared applied dose can be used for both the C2A region and the C2G region of a transistor.

Figure 4B:
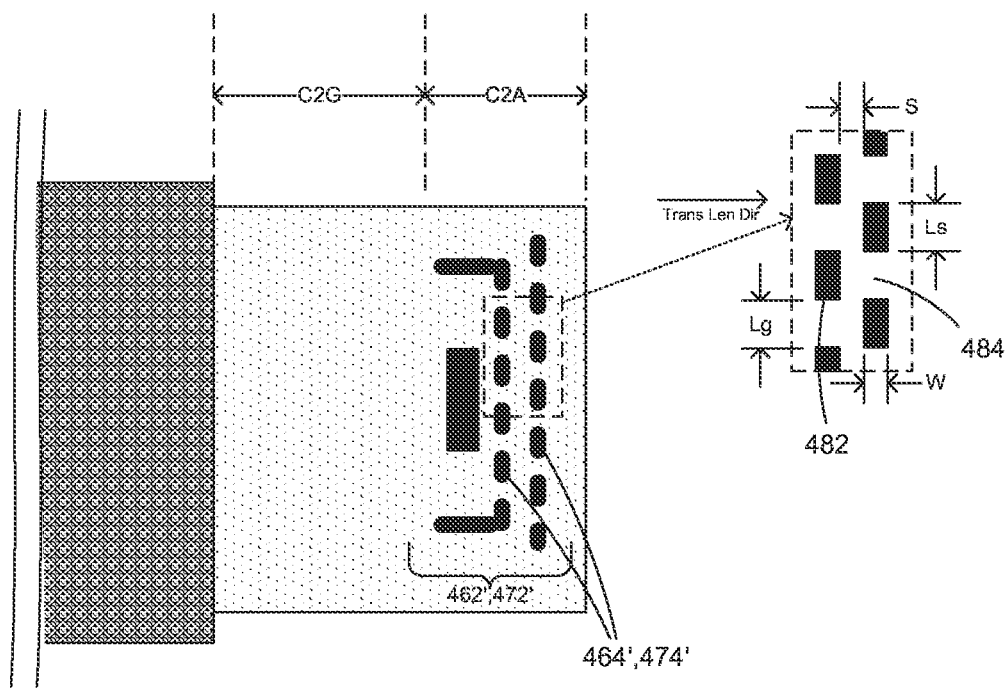
FIG. 4B illustrates partial top plan views of another embodiment of an implant screen for a contact-to-active area edge region in accordance with the present disclosure.

Similar to the C2G implant screens discussed above, in some embodiments, the width of the feature (e.g., reticle line) is kept as close as possible to the critical distance to help ensure that the dopant will diffuse under the feature so as to keep continuity of the implant in the region, which ensures there is electrical continuity. If the width of the line is too large, there can be a break in the implant continuity created by the implant dose because the implant will not diffuse under the feature. When thin features are not possible and/or to further ensure there is continuity of the diffused implant, the C2A implant screen, similar to the C2G implant screen, can include one or more discontinuous features such as, for example, dashed lines. In some embodiments, as seen in FIG. 4B, implant screens 462',472', corresponding to the C2A regions of a transistor, can include one or more pairs of dashed lines 464',474'. As seen in the expanded portion (dotted box) in FIG. 4B, each dashed line 464', 474' can include a solid portion 482 and a gap portion 484, with each pair of lines 464', 474' separated by a spacing S. In some embodiments, each pair of dashed lines 464', 474' can be the equivalent of one solid line with respect to dopant implant blocking capability. In some embodiments, the pair of dashed lines 464',474' can be offset with respect to each other such that a solid portion 482 of a dashed line is aligned with a gap portion 484 of an adjacent dashed line. In some embodiments, the alignment is such that there is no gap in the pair of dashed lines 464',474' when viewed along the length direction of the transistor (see arrow). The combination of the gap portions 484 and spacing S between the dashed lines 464',474', ensures that there will always be implant continuity (e.g., in a zig-zag pattern). Thus, the need to have complete lateral implant diffusion under each feature of the implant screen 462, 474 is less of a concern in this embodiment. In some embodiments, the length Ls of the solid portions 482 can be equal to the length Lg of the gap portions 484. In other embodiments, the length Ls of the solid portions 482 can be greater than or less than the length Lg of the gap portions 484. In some embodiments, the dimensions of the solid portions 482 within each line and/or the dimensions of the gap portions 484 within each line can be same, e.g., Lg equals Ls within each line. In some embodiments, at least one solid portion 482 can have a different dimension than other solid portions 482 within a dashed line 464',474' and/or at least one gap portion 484 can have a different dimension than other gap portions 484 within a dashed line 464',474'. The width W of the solid portions 482 can be 0.04 μm or greater. In some embodiments, the width W of the solid portions 482 can be in a range of 0.04 μm to 0.15 μm and the length Ls of the solid portions 482 and gap portions 484 can be in a range of 0.2 μm to 0.4 μm.

Figure 5:
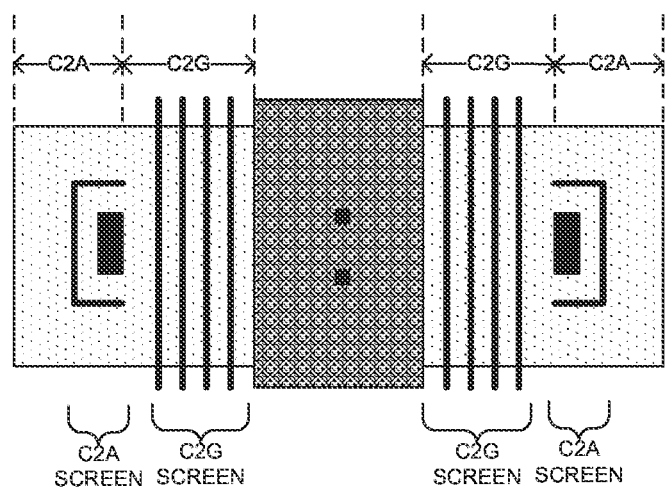
FIG. 5 illustrates a top plan view of a transistor with implant screens in the contact to gate and contact to edge of active area regions in accordance with the present disclosure.

In the embodiment of FIG. 4A, implant screens are only located in the C2A regions. However, implant screens can be used in both the C2G region(s) and the C2A region(s) as shown in FIG. 5. The C2G implant screens and the C2A implant screens can be the same as any of the appropriate implant screens discussed above. Accordingly, further discussion of the implant screen in FIG. 5 is omitted. When a transistor has both the C2G and C2A implant screens, the C2G and C2A implant screens allow for an applied dose to be shared with one or both C2G and C2A regions of other transistors. Any combination of C2A and C2G implant screens can be used among the different transistors so that a shared applied dose can be used during a single dopant implant step. For example, the ADRs of any number of transistors can be shifted using a combination of C2A and/or C2G implant screens so that the effective doses of the respective C2A/C2G regions can be reduction to ensure that the regions use a shared applied dose. That is, a single applied dose can be used for all the transistors. The single applied dose can correspond to a transistor region requiring the highest effective dose (e.g., a C2G region without an implant screen that requires the highest effective dose).

Those skilled in that understand the details of a fabrication process for a transistor and thus, for brevity, details related to photoresist layers, masks, chemical and/or plasma etching, dopant implant techniques (e.g., plasma doping, ion implant, isotropic diffusion) and other known details are omitted. In some embodiments, a method of forming a device having one or more transistors can include forming lightly doped regions on a substrate corresponding to the one or more transistors. Each of the lightly doped regions can have respective acceptable dose ranges for a dopant implant. One or more of the respective acceptable dose ranges can have different dose ranges for the dopant implant. In some embodiments, the method can include doping the lightly doped regions with the dopant implant during a same implant step. That is, a shared applied dose can be used.

However, to use the shared applied dose, the acceptable dose range of one or more of the lightly doped regions may need to be shifted so as to overlap with the acceptable dose ranges of the other lightly doped regions. As discussed above, the acceptable dose ranges can be shifted by using an implant screens to reduce an effective dose in the lightly doped regions. In some embodiments, the formation of the implant screen includes providing a polysilicon layer over the appropriate C2A and/or C2G region and, after a masking process, etching the polysilicon layer to expose a portion of the surface of the C2A and/or C2G region and leave at least one polysilicon feature that blocks a remaining portion of the surface of the C2A and/or C2G region. After the polysilicon gate etching, a dopant is implanted to an exposed portion of the surface of the screened region to form a lightly doped region. The dopant implant can be self-aligned to the gate edge. In some embodiments, the at least one polysilicon feature is configured to reduce an effective dose in the screened region so as to shift an acceptable dose range of the dopant implant to a higher dose range. The acceptable dose range can correspond to acceptable breakdown voltage values for the C2A and/or C2G region. In some embodiments, the at least one polysilicon feature is configured such that dopant implant diffuses laterally under the at least one polysilicon feature to maintain continuity. For example, the implant will diffuse under the implant scree features and gate a certain amount due to implant straggle and/or thermally driven diffusion from subsequent process steps (e.g., lateral diffusion can occur during an annealing process). The small feature(s) of the implant screen allow the dopant implant to bridge the silicon under the feature(s) to maintain continuity, but the average implant dose concentration will be reduced under the features and between features (e.g., due to depletion from diffusion).

Transistors having implant screens in accordance with the present disclosure enable high BV without requiring separate dopant implant steps for the C2G and/or C2A regions of the same transistor or different transistors. In addition, in a conventional process, overlap of masks becomes important for managing BV and device performance, but more masks result in higher cost and potential high-volume manufacturing variation. Transistors having implant screens in accordance with the present disclosure minimize or eliminate the use of separate masks for different transistors. Although specific embodiments have been illustrated and described herein, it will be appreciated by those of ordinary skill in the art that any arrangement that is calculated to achieve a similar (e.g., the same) purpose may be substituted for the specific embodiments shown. In addition, exemplary embodiments of the present disclosure are described with respect to C2G and C2A regions of a transistor. However, those skilled in the art will understand that the teachings of the present disclosure can be applicable to other types of transistors/devices where a reduction in the effective dose and/or use of a shared applied dose is desirable.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. An apparatus, comprising:
a substrate; and
a lightly doped region on the substrate,
wherein the lightly doped region includes an implant screen configured to reduce an effective dose in the lightly doped region so as to shift an acceptable dose range in the portion of the lightly doped region to a higher dose range.

2. The apparatus of claim 1, wherein the acceptable dose range corresponding to acceptable breakdown voltage values for the lightly doped region.

3. The apparatus of claim 1, wherein the acceptable dose range overlaps with a second acceptable dose range for a second doped region in the apparatus, the second doped region having a higher effective dose than the effective dose of the lightly doped region.

4. The apparatus of claim 1, wherein the implant screen includes at least one feature to block the dopant implant.

5. The apparatus of claim 4, further comprising:
a transistor disposed on the substrate, the transistor including,
a source and a source contact disposed on the source,
a drain and a drain contact disposed on the drain, and
a gate disposed between the source contact and the drain contact.

6. The apparatus of claim 5, wherein the at least one feature includes a plurality of reticle lines that are dashed lines having a solid portion and a gap portion.

7. The apparatus of claim 6, wherein the dashed lines are arranged such that solid portion of a dashed line align with the gap portion of an adjacent line when viewed in a length direction of the transistor.

8. The apparatus of claim 6, wherein the at least one feature includes a plurality of reticle lines that are solid lines.

9. The apparatus of claim 6, wherein the implant screen is disposed in a contact-to-gate region of the transistor,
wherein the at least one feature includes a plurality of reticle lines extending in a width direction of the transistor,
wherein the apparatus includes shallow trench isolation regions on opposing sides of the lightly doped region in the width direction of the transistor, and
wherein both ends of each of the reticle lines extend into the respective shallow trench isolation regions.

10. The apparatus of claim 9, wherein the ends the reticle lines on at least one side of the implant screen are connected to the gate by a connection layer to form a field plate.

11. The apparatus of claim 9, wherein the ends of the reticle lines are not connected to the gate to form a floating configuration.

12. The apparatus of claim 6, wherein the implant screen is disposed in a contact-to-active area region of the transistor, and
wherein the at least one feature includes at least one reticle line that forms a C-shaped configuration around the corresponding gate contact or drain contact.

13. The apparatus of claim 12, wherein the C-shaped configuration is centered between the corresponding contact and an edge of an active area of the lightly doped region.

14. A method, comprising:
doping with a dopant implant to form a lightly doped region on a substrate; and
reducing an effective dose in the lightly doped region by forming an implant screen in a portion of the lightly doped region prior to the doping such that an acceptable dose range in the portion of the lightly doped region is shifted to a higher dose range.

15. The method of claim 14, further comprising:
forming a second lightly doped region on the substrate during a same implant step as the doping to form the lightly doped region, the second lightly doped region having a second acceptable dose range that overlaps with the higher dose range.

16. The method of claim 15, wherein the overlap is such that a shared dosage concentration is used for the dopant implant.

17. The method of claim 16, wherein a same transistor includes the lightly doped region and the second lightly doped region, and
wherein the lightly doped region corresponds to a contact-to-active area region or a contact-to-gate region and the second lightly doped region corresponds to the other of the contact-to-active area region or the contact-to-gate region.

18. The method of claim 16, wherein a first transistor includes the lightly doped region and a second transistor includes the second lightly doped region,
- wherein the lightly doped region corresponds to a contact-to-active area region or a contact-to-gate region in the first transistor, and
- wherein the second lightly doped region corresponds to a contact-to-active area region or a contact-to-gate region in the second transistor.

19. The method of claim 14, further comprising:
- forming an implant screen to block at least a portion of the dopant implant directed to the lightly doped region to perform the reduction in the effective dose of the lightly doped region.

20. The method of claim 19, wherein the forming of the implant screen includes,
- providing a polysilicon layer over at least the lightly doped region,
- etching the polysilicon layer to expose a portion of a surface of the lightly doped region and leave at least one polysilicon feature that blocks a remaining portion of the surface of the lightly doped region; and
- implanting a dopant into the exposed portion of the surface of the lightly doped region,
- wherein the at least one polysilicon feature is configured to reduce the effective dose in the lightly doped region such that the lightly doped region has an acceptable breakdown voltage value.

* * * * *